United States Patent [19]

Chang et al.

[11] Patent Number: 5,808,494
[45] Date of Patent: Sep. 15, 1998

[54] APPARATUS AND METHOD FOR GENERATING A CLOCK IN A MICROPROCESSOR

[75] Inventors: Joseph Yih Chang, Cedar Park; Charles Gordon Wright, Round Rock, both of Tex.

[73] Assignee: International Business Machines Corporation, Armonk, N.Y.

[21] Appl. No.: 703,856

[22] Filed: Aug. 27, 1996

Related U.S. Application Data

[63] Continuation of Ser. No. 221,674, Apr. 1, 1994, abandoned.

[51] Int. Cl.$^6$ .................................................. H03K 23/00
[52] U.S. Cl. .......................... 327/115; 327/117; 327/147; 327/156; 377/48
[58] Field of Search ...................... 327/144–147, 327/150, 155–162, 39, 40, 46–49, 115, 116, 117, 119, 121; 331/25; 377/48

[56] References Cited

U.S. PATENT DOCUMENTS

| | | | |
|---|---|---|---|
| 3,959,737 | 5/1976 | Tanis ........................................... | 377/48 |
| 4,031,317 | 6/1977 | McClain et al. . | |
| 4,573,176 | 2/1986 | Yeager ........................................ | 377/48 |
| 4,639,680 | 1/1987 | Nelson . | |
| 4,715,050 | 12/1987 | Tanaka et al. . | |
| 4,757,264 | 7/1988 | Lee et al. . | |
| 4,847,516 | 7/1989 | Fujita et al. ............................. | 327/147 |
| 4,896,338 | 1/1990 | Rouillet et al. . | |
| 4,965,531 | 10/1990 | Riley ........................................ | 331/25 |
| 4,991,188 | 2/1991 | Perkins ...................................... | 377/48 |
| 5,040,197 | 8/1991 | Thoobald .................................. | 377/48 |
| 5,055,800 | 10/1991 | Black et al. ............................... | 331/25 |
| 5,073,730 | 12/1991 | Hoffman . | |
| 5,079,521 | 1/1992 | Gaskell et al. ............................ | 377/48 |
| 5,087,829 | 2/1992 | Ishibashi et al. ....................... | 327/152 |
| 5,088,057 | 2/1992 | Amrany et al. ........................... | 377/48 |
| 5,095,233 | 3/1992 | Ashby et al. . | |
| 5,111,160 | 5/1992 | Hershberger . | |
| 5,124,670 | 6/1992 | Lawton ..................................... | 331/25 |
| 5,144,254 | 9/1992 | Wilke ...................................... | 327/156 |
| 5,161,173 | 11/1992 | Nordby . | |
| 5,187,722 | 2/1993 | Petty ....................................... | 331/25 |
| 5,208,546 | 5/1993 | Nagaraj et al. ......................... | 327/157 |
| 5,307,381 | 4/1994 | Ahuja ..................................... | 327/156 |
| 5,345,109 | 9/1994 | Mehta ..................................... | 377/47 |
| 5,420,545 | 5/1995 | Davis et al. ............................. | 331/25 |

FOREIGN PATENT DOCUMENTS

| | | | |
|---|---|---|---|
| 57-18128 | 1/1982 | Japan ...................................... | 377/47 |
| 60-3228 | 1/1985 | Japan ...................................... | 377/47 |
| WO92/07316 | 4/1992 | WIPO . | |

OTHER PUBLICATIONS

Electronic Design, vol. 39, No. 17, 12 Sep. 1991, Miller et al., Improve Clock Synthesis In Laptops With A Frequency Generator.

"TP 12.1: A 3.3V 0.6um BiCMOS Supescalar Microprocessor", 1994 IEEE Solid–State Circuits Conf., IEEE, Feb. 1994, Cat. No. 94CH3410–8, pp. 201–203.

*Primary Examiner*—Timothy P. Callahan
*Assistant Examiner*—T. T. Lam
*Attorney, Agent, or Firm*—Lisa B. Yociss; Andrew J. Dillon

[57] ABSTRACT

A method and apparatus are provided for generating a ratioed clock signal. A first clock signal having a first frequency is output. At least one gating signal indicating ratio is output. In response to the first clock signal and the gating signal, a second clock signal is output. The second clock signal has a frequency that is substantially related to the first frequency by the ratio.

19 Claims, 5 Drawing Sheets

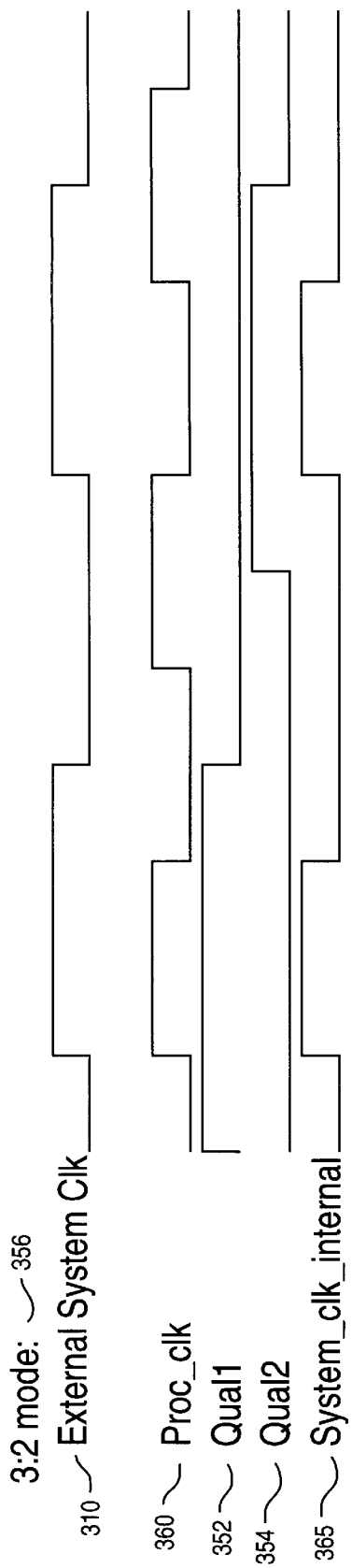

APPARATUS AND METHOD FOR GENERATING A CLOCK IN A MICROPROCESSOR

This is a continuation, of application Ser. No. 08/221,674, filed Apr. 1, 1994 now abandoned.

CROSS-REFERENCE TO RELATED APPLICATIONS

The present invention relates to application Ser. No. 08/228,470 entitled "Apparatus and Method for Generating a Phase-Controlled Clock Signal" filed on Apr. 15, 1994 and bearing attorney docket number AT9-94-024.

BACKGROUND OF THE INVENTION

1. Field of the Invention

The present invention relates to electronic circuitry and, more particularly, to an apparatus and method for generating ratioed clock signals within a microprocessor.

2. Description of the Related Art

Conventionally, the internal clock of a microprocessor (i.e. "processor clock") operates at substantially the same rate as, or at a simple integer multiple of, the external system clock frequency. For example, the microprocessor of a system may by capable of running at 66 MHz, while the external system clock may only be capable of running at one-half, one-third, or one-fourth of that frequency (i.e. 33, 22, or 16.5 MHz, respectively).

Microprocessors typically comprise a conventional phase-lock loop clock generator for generating a processor clock signal in response to the external system clock signal. Referring to FIG. 1, conventional phase-lock loop clock generator 100 comprises delay element 110, which receives an external system clock signal and outputs a delayed system clock signal that substantially matches the propagation delay of divider 150 (its function described herein).

Phase comparator 120 receives both the delayed system clock signal from delay element 110 and a "clock" signal from divider 150. Phase comparator 120 includes circuitry for generating a DC voltage in response to any variation in phase or frequency between those clock signals.

Illustratively, if the phase of the "clock" signal lags the delayed system clock signal, phase comparator 120 outputs a slightly larger DC voltage. Similarly, if the frequency of the "clock" signal lags the delayed system clock signal, phase generator 120 outputs a large DC voltage.

In turn, voltage controlled oscillator ("VCO") 130 outputs a signal having a clock frequency that is responsive to the voltage output of phase comparator 120. That is, the larger the voltage output of phase comparator 120, the higher the frequency of the clock signal output by VCO 130. Conversely, the smaller the voltage output of phase comparator 120, the lower the frequency of the clock signal output by VCO 130.

In this manner, VCO 130 and phase comparator 120 operate together to ensure that the phase and frequency of the "clock" signal substantially match the delayed system clock signal at the input of phase comparator 120. Several iterations may be necessary to substantially match these clock signals.

H-tree distribution network (herein "H") 140 distributes the output of VCO 130 throughout the microprocessor. This output operates as the internal processor clock signal, which is driven locally by multiple clock regenerators 142 residing on H 140.

The output of clock regenerator 146 is fed back to divider 150, which divides that output's frequency by a factor of n. This n factor represents the desired ratio between the processor clock frequency and the external system clock frequency. In turn, divider 150 outputs the "clock" signal to phase comparator 120. However, because phase comparator 120 and VCO 130 ensure that the "clock" signal has substantially the same frequency/phase as the delayed system clock signal, VCO 130 eventually outputs an internal processor clock signal having a frequency that is a multiple of the external system clock frequency. Accordingly, this internal processor clock signal has a frequency of n times the external system clock frequency.

Preferably, the external system clock signal operates at its maximum possible frequency, as determined largely by the system design. For example, the optimum external system clock frequency may be 66 MHz, while the optimum internal clock frequency of a microprocessor may be 100 MHz, which is one and one-half times the optimum external system clock frequency.

However, because clock generator 100 generates a frequency which is an integer multiple (i.e. "n") of the external system clock frequency, clock generator 100 cannot generate that optimum processor clock frequency. Therefore, clock generator 100 has the disadvantage of only supporting an n:1 clock ratio of the processor clock frequency to the external system clock frequency. Accordingly, there is a great need for a clock generator that generates and distributes an n:m ratioed clock signal within a microprocessor, where both m and n are integers.

Microprocessors typically comprise some logic, such as a bus interface unit, that operates at the external system clock frequency. Unfortunately, however, clock generator 100 only generates one internal high-speed processor clock signal. Therefore, another method of distributing the external system clock signal to the bus-driven logic must be utilized, such as an additional H-tree distribution network.

Accordingly, there is a great need for a clock regenerator that generates and distributes both an internal processor clock signal and an internal system clock signal throughout a microprocessor using the same H-tree distribution network. That is, such a clock generator should be capable of generating and distributing multiple in-phase clock signals within the microprocessor, including capability for n:m ratios.

Furthermore, delay element 110 compensates for the propagation delay of divider 150 by receiving the external system clock signal and outputting a delayed system clock signal having a phase that substantially matches the "clock" signal of divider 150. However, because delay element 110 cannot completely match the propagation delay of divider 150, the "clock" signal is slightly skewed in comparison to the delayed system clock signal, resulting in overall system slow down. Accordingly, there is a great need for a clock regenerator having a design implementation that does not require a delay element.

SUMMARY OF THE INVENTION

A method is provided to generate a processor clock signal having an n:m ratio to an external system clock signal and to generate an internal system clock signal. The method includes the steps of comparing the internal system clock signal to the external system clock signal to produce a DC voltage output, generating the processor clock signal in response to that DC voltage output, generating multiple gating signals in response to the processor clock signal and the n:m ratio, generating the internal system clock signal in response to those gating signals and the processor clock signal, and distributing the processor clock signal and the internal system clock signal throughout a processor.

Furthermore, an apparatus generates an internal system clock signal and a processor clock signal having an n:m ratio to an external system clock signal. The apparatus includes a comparator for comparing the internal system clock signal to the external system clock signal to produce a DC output voltage, an oscillator that generates a processor clock signal in response to that DC output voltage, qualifier logic that generates multiple gating signals in response to the processor clock signal and the n:m ratio, and clock regenerators that regenerate the internal system clock signal in response to the gating signals and the processor clock signal. The regenerator also distributes the processor clock signal and the internal system clock signal throughout a processor.

Therefore, it is an object of the present invention to generate an internal processor clock frequency having an n:m ratio to the external system clock frequency.

It is a further object of the present invention to generate and distribute an internal processor clock signal and an internal system clock signal throughout the microprocessor in response to an external system clock signal.

These and other objects, advantages, and features will become even more evident by the following drawings and detailed description.

BRIEF DESCRIPTION OF THE DRAWINGS

FIG. 5(A)–5(C) is a timing diagram in accordance with the present invention.

DETAILED DESCRIPTION OF THE PREFERRED EMBODIMENTS

Figure 1:
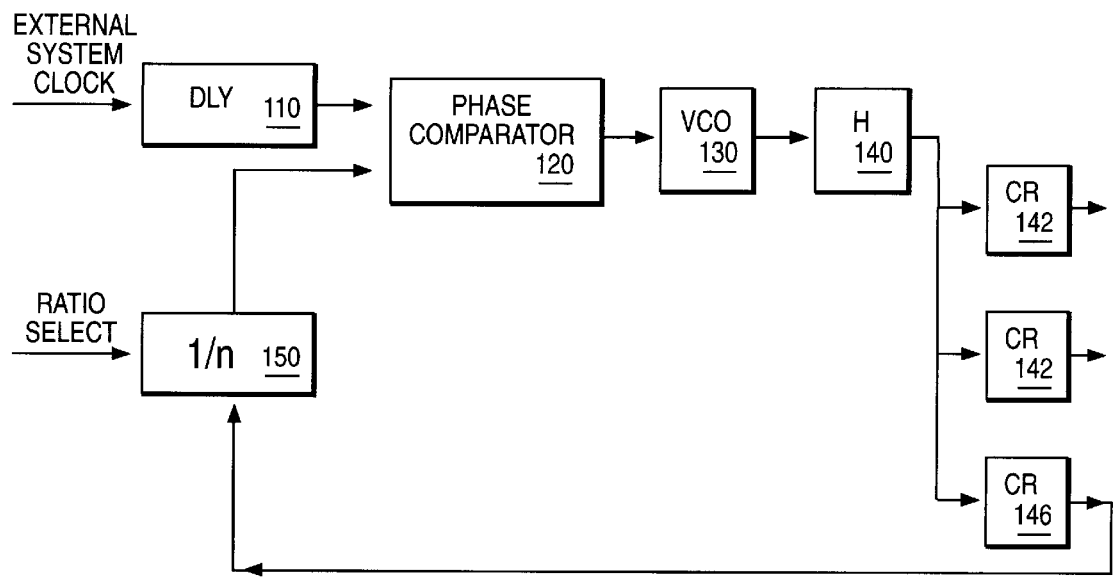
FIG. 1 is a prior art phase-lock loop clock generation and distribution scheme.
Figure 2:
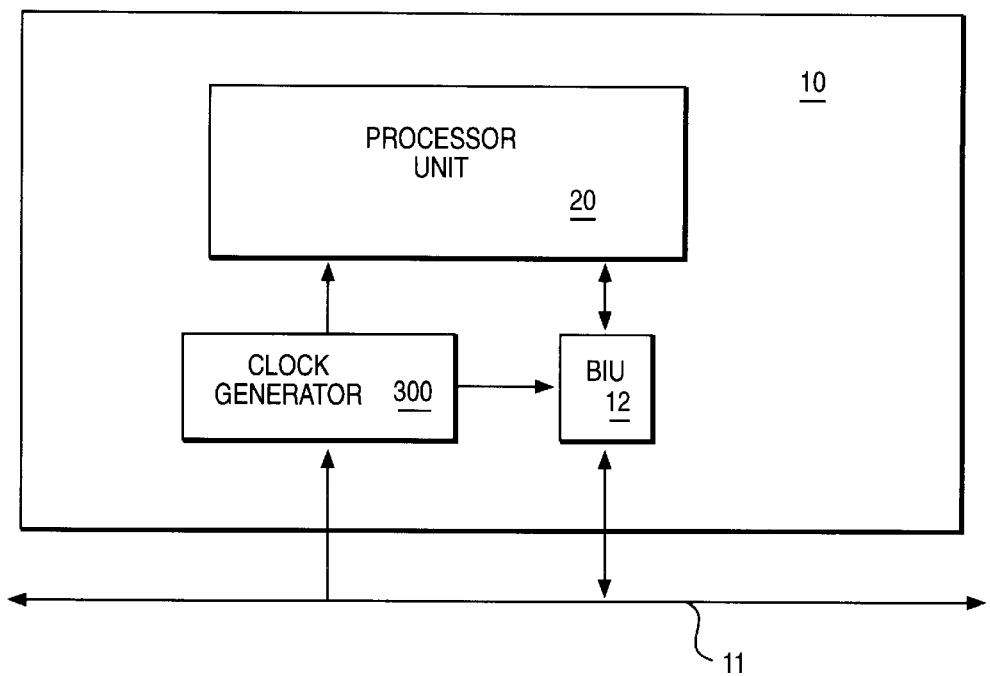
FIG. 2 is a block diagram of a microprocessor for processing information according to the preferred embodiment.

Referring to FIG. 2, the present invention is implemented within microprocessor 10, which is a single integrated circuit superscalar microprocessor. Microprocessor 10 operates according to reduced instruction set computing ("RISC") techniques. However, it should be understood that the present invention can be implemented within other processors and on other hardware platforms.

System bus 11 includes data lines and a clock line. The clock line is connected to clock generator 300 of the present invention, while the data lines are connected to bus interface unit ("BIU") 12. BIU 12 controls the transfer of information between processor unit 20 and system bus 11. Clock generator 300 generates and distributes an internal processor clock signal to, for example, processor unit 20 and an internal system clock signal to, for example, BIU 12. These signals are generated in response to the clock line of system bus 11.

Figure 3:
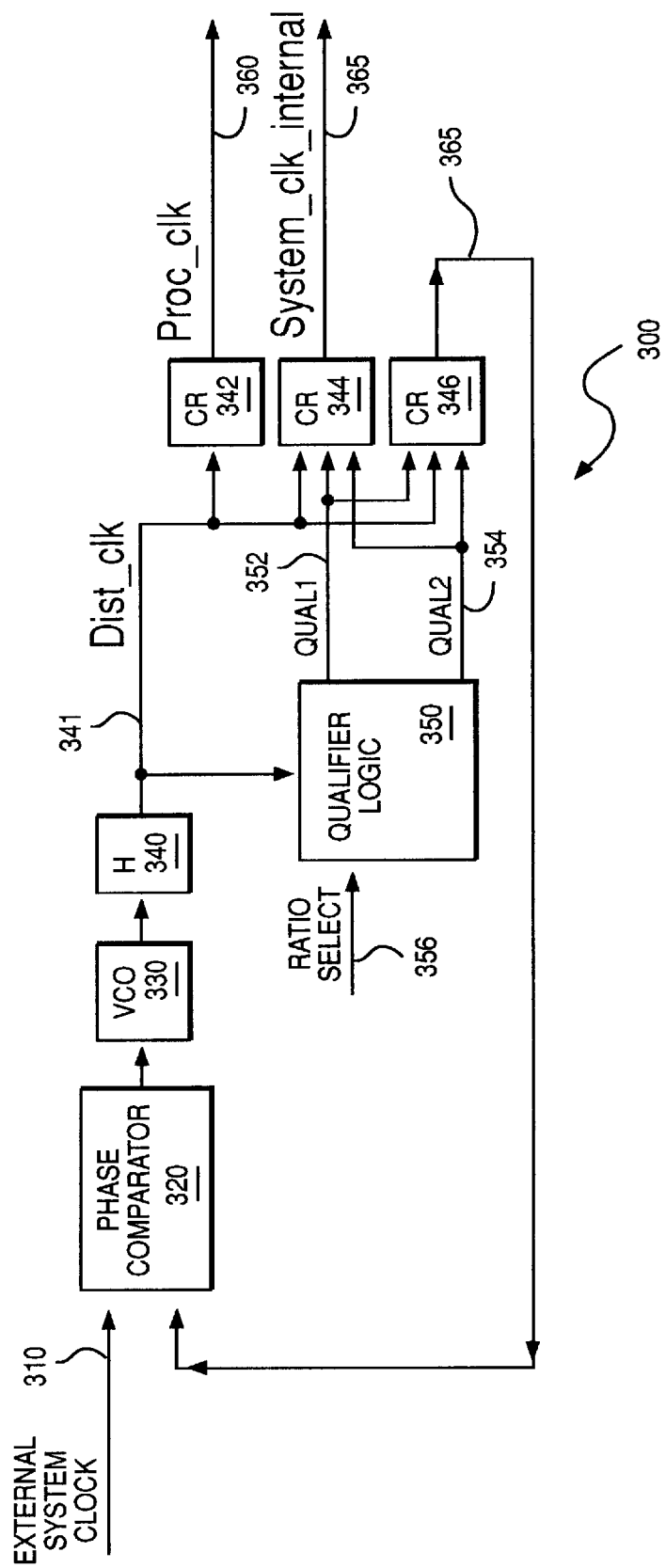
FIG. 3 is the preferred embodiment of a phase-lock loop clock generator and distribution scheme of the present invention.

Referring to FIG. 3, clock generator 300 includes phase comparator 320, voltage controlled oscillator ("VCO") 330, H-tree distribution network ("H") 340, qualifier logic ("QL") 350, and clock regenerators ("CR") 342, 344, and 346.

Clock generator 300 generates both an internal processor clock signal and an internal system clock signal in response to external system clock signal 310. To do this, phase comparator 320 receives both internal system clock signal 365 (herein referred to as "System_clk_internal") from CR 346 and external system clock signal 310 from system bus 11 (see FIG. 2). Phase comparator 320 includes circuitry for generating a DC voltage in response to any variation in phase or frequency between these clock signals.

Illustratively, if the phase of System_clk_internal 365 lags the phase of external system clock signal 310, phase comparator 320 outputs a slightly larger DC voltage. Similarly, if the frequency of System_clk_internal 365 lags the frequency of external system clock signal 310, phase comparator 320 outputs a large DC voltage.

In turn, VCO 330 includes circuitry for generating a 50% duty cycle square-wave clock signal having a frequency that is responsive to the voltage output of phase comparator 320. That is, the larger the voltage output of phase comparator 320, the higher the frequency of the clock signal output by VCO 330. Conversely, the smaller the voltage output of phase comparator 320, the lower the frequency of the clock signal output by VCO 330.

In this manner, VCO 330 and phase comparator 320 operate together to ensure that the phase and frequency of System_clk_internal 365 substantially match the phase and frequency of external system clock signal 310 at the input of phase comparator 320. Several iterations may be necessary to substantially match these clock signals.

H 340 distributes the output of VCO 330 (i.e. Dist_clk 341) to QL 350 and to multiple nodes throughout the microprocessor. Each node is equidistant from VCO 330 and includes one of multiple CRs 342, 344, or 346. However, it should be understood that other distribution networks may be used to distribute the output of VCO 330 throughout the microprocessor.

Figure 4:
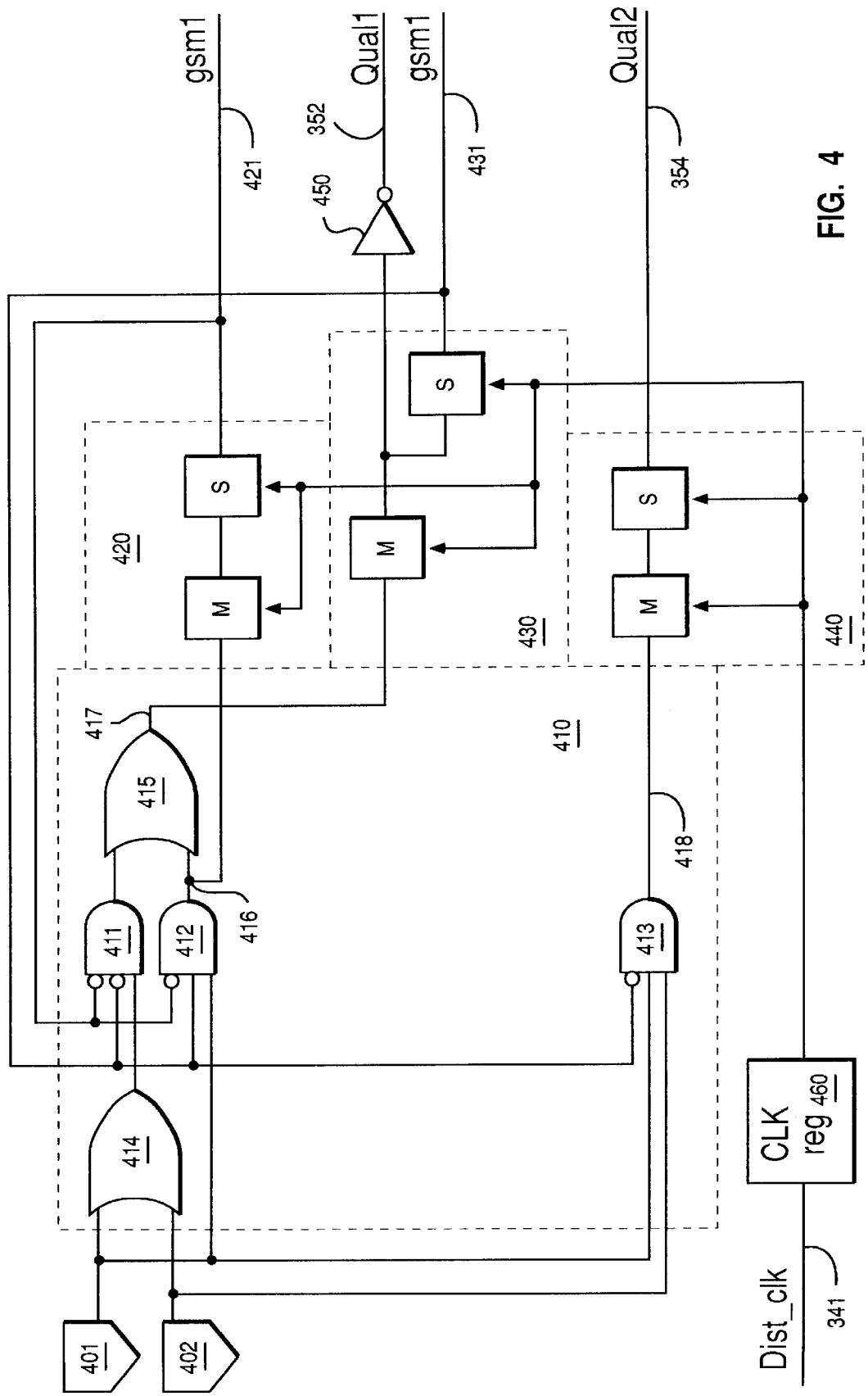
FIG. 4 is a schematic diagram of the qualifier logic.

Referring to FIG. 4, QL 350 includes input circuitry 410, master/slave latches 420, 430, and 440, invertor 450, and clock regenerator 460. Input circuitry 410 includes AND gates 411–413 and OR gates 414–415. Clock regenerator 460 regenerates and distributes Dist_clk 341 to master/slave latches 420, 430, and 440. As such, during negative cycles of Dist_clk 341, the master latch opens and the slave latch latches. Conversely, during positive cycles of Dist_clk 341, the master latch latches and the slave latch opens. Latches 420, 430, and 440 are triggered on the positive edges of Dist_clk 341.

Input circuitry 410 receives a user-defined n:m ratio of the processor's clock frequency to the external system clock signal's frequency. Ratio select input 356 (see FIG. 3) includes a set of input pins 401 and 402 for defining the desired n:m ratio. For example, strapping or applying zeros (i.e. "0, 0") to pins 401 and 402 corresponds to a 1:1 ratio, applying "0, 1" to pins 401 and 402, respectively, corresponds to a 2:1 ratio, "1, 0" corresponds to a 3:1 ratio, and "1, 1" corresponds to a 3:2 ratio. Alternately, additional pins could be provided to specify other ratios.

In response to that user-defined ratio and the phase/frequency of Dist_clk 341, input circuitry 410 generates three output signals 416–418. Output signal 416 is latched by master/slave latch 420 and then fed back to input circuitry 410. Output signal 417 is latched by the master latch of master/slave latch 430 and then inverted by invertor 450 to generate gating signal Qual1 352. The slave latch of master/slave latch 430 latches the previously latched signal from its master latch, which is then fed back to input circuitry 410. Finally, output signal 418 is latched by master/slave latch 440 to generate gating signal Qual2 354.

Therefore, QL 350 receives the n:m ratio and Dist_clk 341 and, in response, generates gating signals Qual1 352 and Qual2 354.

FIGS. 5A, 5B, and 5C illustrate timing diagrams for QL 350 according to the user-selected ratios of 3:2, 2:1, and 3:1, respectively. Specifically, FIGS. 5A, 5B, and 5C illustrate external system clock signal 310, Proc_clk 360 (i.e. Dist_clk 341), gating signal Qual1 352, gating signal Qual2 354, and System_clk_internal 365. In these diagrams, each external system clock signal 310 has the same frequency, phase, and duty cycle.

However, in FIG. 5A, Proc_clk 360 has a frequency of 1.5 times the frequency of external system clock signal 310. In FIG. 5B, Proc_clk 360 has a frequency of 2 times the frequency of external system clock signal 310. Furthermore, in FIG. 5C, Proc_clk 360 has a frequency of 3 times the frequency of external system clock signal 310.

Moreover, as shown in FIGS. 5A, 5B, and 5C, each System_clock_internal 365 is substantially in phase and frequency with its corresponding external system clock signal 310, albeit having a different duty cycle. That is, the leading edge of each System_clk_internal 365 substantially matches the leading edge of its corresponding external system clock signal 310.

Figure 6:
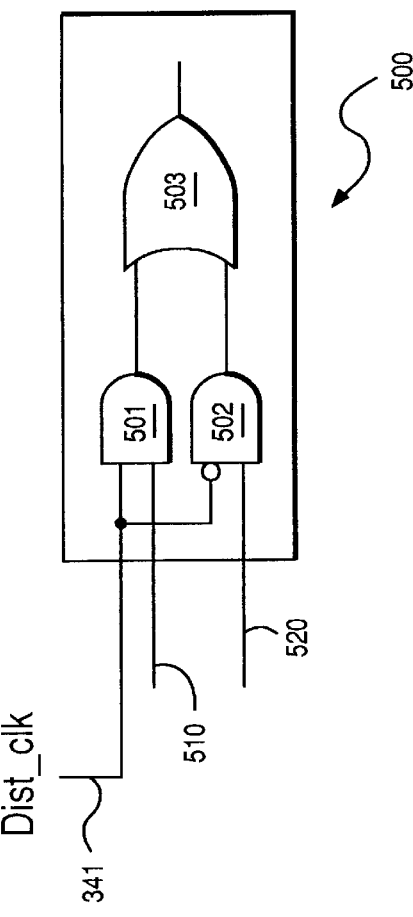
FIG. 6 is a schematic diagram of the input circuitry for clock regenerators of the present invention.

Referring to FIGS. 3 and 6, each CR 342, 344 and 346 includes input circuitry 500 for generating either Proc_clk 360 or System_clk_internal 365. These clock signals are generated in response to Dist_clk 341 and the signals applied at inputs 510 and 520.

To generate System_clk_internal 365, inputs 510 and 520 of CR 344 and 346 receive Qual1 352 and Qual2 354, respectively. Gate 501 "ANDS" Dist_clk 341 and Qual1 352, while gate 402 "ANDS" Qual2 354 and an inverted Dist_clk 341. In turn, gate 503 "ORS" the outputs of gates 501 and 502 to generate System_clk_internal 365.

To generate Proc_clk 360, inputs 510 and 520 of CR 342 are held at a constant "1" and "0", respectively. As a result, CR 342 regenerates a clock signal (i.e. Proc_clk 360) that is substantially equivalent in phase and frequency to Dist_clk 341. Alternately, for ratios larger than 3:2 (e.g. 4:3, 5:4), QL 350 could generate two additional gating signals to be applied at inputs 510 and 520.

Summarizing, QL 350 operates with each CR 344 and CR 346 to multiply Dist_clk 341 by a factor of "n" (e.g. 1, 2, or 3) and then divide the resultant by a factor of "m" (e.g. 1 or 2) to produce System_clk_internal 365. To do this, QL 350 generates Qual1 352 and Qual2 354 in response to Dist_clk 341 and the user-defined n:m ratio. Next, each input circuitry 500 of CR 344 and 346 generates System_clk_internal 365 in response to Dist_clk 341, Qual1 352, and Qual2 354.

The output of CR 346 (i.e. System_clk_internal 365) is fed back to phase comparator 320. Because phase comparator 320 and VCO 330 ensure that System_clk_internal 365 has substantially the same frequency/phase as external system clock signal 310, VCO 330 eventually outputs a signal (i.e. Dist_clk 341) having a frequency that is n/m times the frequency of external system clock signal 310.

Figure 7:
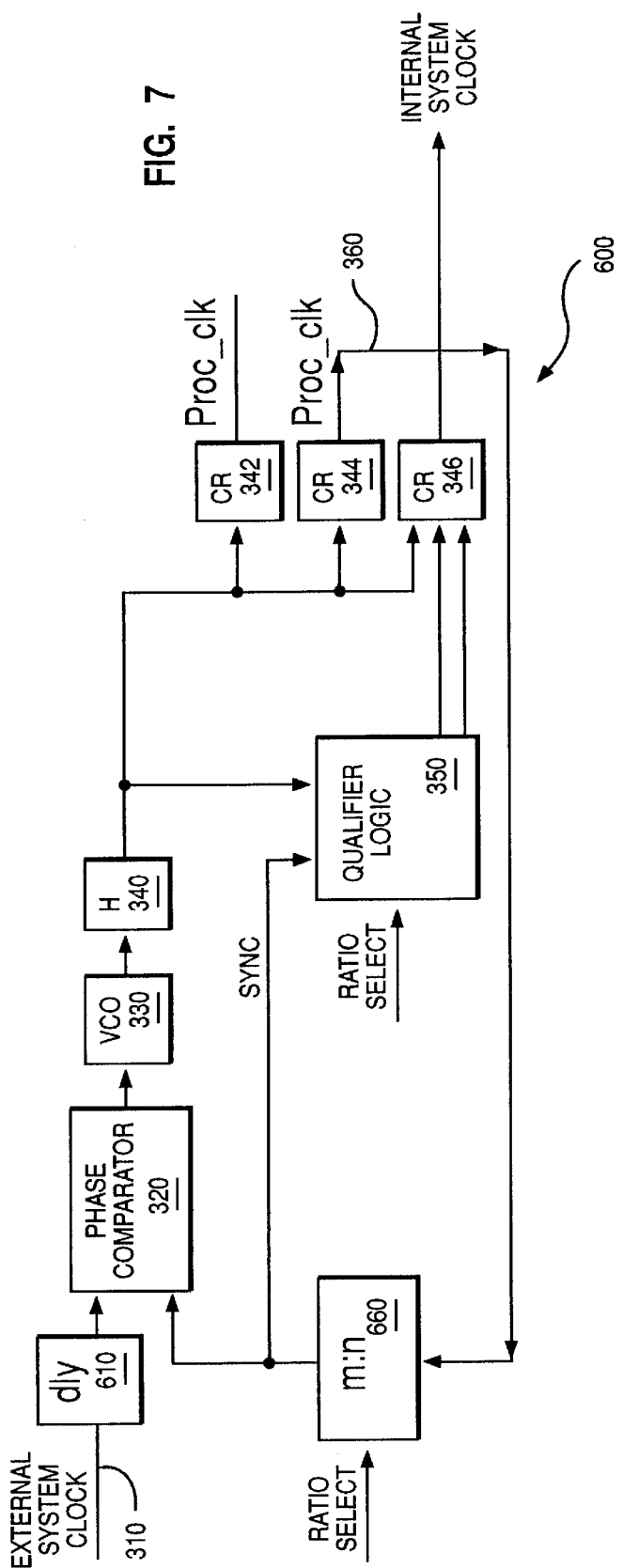
FIG. 7 is second embodiment of a phase-lock loop clock generator and distribution scheme of the present invention.

FIG. 7 illustrates a second embodiment of clock generator 600, which includes delay element 610, phase comparator 320, voltage controlled oscillator ("VCO") 330, H-tree distribution network ("H") 340, qualifier logic ("QL") 350, clock regenerators ("CR") 342, 344, and 346, and divider 660.

The output of CR 344 (i.e. Proc_clk 360) is fed back to divider 660. Divider 660 includes circuitry which multiplies Proc_clk 360 by a factor of "n" and divides the resultant by a factor of "m". Delay element 610 receives external system clock signal 310 and generates a delayed system clock signal that substantially matches the propagation delay of divider 660. In all other respects, clock generator 600 functions substantially the same as clock generator 300 (see FIG. 3).

While the invention has been shown and described with reference to particular embodiments thereof, it will be understood by those skilled in the art that the foregoing and other changes in form and detail may be made therein without departing from the spirit and scope of the invention. For example, QL 350 could generate additional gating signals to be applied to clock regenerators 342, thereby permitting a larger ratio (e.g. 4:3, 5:4, etc.) between the frequency of Proc_clk 360 and the frequency of external system clock signal 310.

We claim:

1. A method of generating a clock signal, comprising the steps of:

outputting a first clock signal having a first frequency;

inputting an n:m ratio and said first clock signal into gating circuitry;

said gating circuitry only outputting a plurality of gating signals indicating said n:m ratio, wherein n divided by m equals a non-integer; and in response to said first clock signal and said plurality of gating signals, outputting a second clock signal having only periods which are each substantially equal to n/m multiplied by an inverse of said first frequency.

2. The method according to claim 1 wherein said step of outputting a first clock signal comprises the steps of:

inputting a system clock signal;

generating an output corresponding to a difference between said second clock signal and said system clock signal; and generating said first clock signal in response to said output.

3. The method according to claim 1 wherein said step of outputting a plurality of gating signals comprises the steps of:

inputting said n:m ratio; and generating said plurality of gating signals in response to said first clock and said n:m ratio.

4. The method according to claim 1 further comprising the step of distributing said first clock signal and said second clock signal throughout a processor.

5. The method according to claim 2 wherein a system clock frequency of said system clock signal substantially equals a frequency of said second clock signal.

6. The method according to claim 1 wherein the m and n of said n:m ratio are integers.

7. The method according to claim 4 wherein said first clock signal is distributed to a processor unit.

8. The method according to claim 4 wherein said second clock signal is distributed to a bus interface unit.

9. An apparatus for generating a clock signal, comprising:

circuitry for outputting a first clock signal having a first frequency;

means for inputting an n:m ratio;

gating circuitry for receiving said n:m ratio and said first clock signal and only outputting a plurality of gating signals indicating said n:m ratio, wherein n divided by m equals a non-integer; and in response to said first clock signal and said plurality of gating signals, output circuitry for outputting a second clock signal having only periods which are substantially equal to n/m multiplied by an inverse of said first frequency.

10. The apparatus according to claim 9 wherein said circuitry comprises:

a comparator for generating an output corresponding to a difference between said second clock signal and a system clock signal; and an oscillator for generating said first clock signal in response to said output of said comparator.

11. The apparatus according to claim 9 wherein said gating circuitry comprises qualifier logic.

12. The apparatus according to claim 11 wherein said qualifier logic comprises a means for receiving said n:m ratio.

13. The apparatus according to claim 9 wherein said output circuitry comprises a clock regenerator.

14. The apparatus according to claim 10 wherein a system clock frequency of said system clock signal substantially equals a frequency of said second clock signal.

15. The apparatus according to claim 9 wherein said gating circuitry for outputting said plurality of gating signals indicating said n:m ratio generates said plurality of gating signals in response to said first clock and said n:m ratio.

16. The apparatus according to claim 9 further comprising means for distributing said first clock signal and said second clock signal throughout a processor.

17. The apparatus according to claim 9 wherein the m and n of said n:m ratio are integers.

18. The apparatus according to claim 16 further comprising means for distributing said first clock signal to a processor unit.

19. The apparatus according to claim 16 further comprising means for distributing said second clock signal to a bus interface unit.

* * * * *